(12) United States Patent
Bassett

(10) Patent No.: US 6,242,814 B1
(45) Date of Patent: Jun. 5, 2001

(54) UNIVERSAL I/O PAD STRUCTURE FOR IN-LINE OR STAGGERED WIRE BONDING OR ARRAYED FLIP-CHIP ASSEMBLY

(75) Inventor: Stephen J. Bassett, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/127,486

(22) Filed: Jul. 31, 1998

(51) Int. Cl.[7] .............................. H01L 27/04; H01L 23/62
(52) U.S. Cl. ..................... 257/786; 257/210; 257/207; 257/691; 257/200; 257/208
(58) Field of Search ................. 257/786, 210, 257/207, 208, 209, 211, 784, 691, 690, 202

(56) References Cited

U.S. PATENT DOCUMENTS

| | | | |
|---|---|---|---|
| 4,685,033 | 8/1987 | Inoue et al. | 361/414 |
| 5,019,889 * | 5/1991 | Shintani et al. | 331/108 C |
| 5,036,163 | 7/1991 | Spielberger et al. | 174/52.4 |
| 5,060,037 * | 10/1991 | Rountree | 257/357 |
| 5,063,429 * | 11/1991 | Crafts | 257/203 |
| 5,075,753 * | 12/1991 | Kozono | 257/207 |
| 5,095,356 * | 3/1992 | Ando et al. | 257/202 |
| 5,155,065 * | 10/1992 | Schweiss | 438/599 |
| 5,182,629 * | 1/1993 | Nowak et al. | 257/577 |
| 5,217,916 * | 6/1993 | Anderson et al. | 438/128 |
| 5,291,043 * | 3/1994 | Arakawa | 257/208 |
| 5,347,150 * | 9/1994 | Sakai et al. | 257/203 |
| 5,420,447 * | 5/1995 | Waggoner | 257/206 |
| 5,514,895 * | 5/1996 | Kikushima et al. | 257/378 |
| 5,545,923 | 8/1996 | Barber | 257/691 |
| 5,548,135 * | 8/1996 | Avery | 257/173 |
| 5,604,161 | 2/1997 | Barber | 437/216 |
| 5,654,588 * | 8/1997 | Dasse et al. | 257/754 |
| 5,689,133 * | 11/1997 | Li et al. | 257/361 |
| 5,691,568 * | 11/1997 | Chou et al. | 257/691 |
| 5,713,037 * | 1/1998 | Wilkinson et al. | 395/800 |
| 5,719,944 * | 2/1998 | Banerjea | 381/61 |
| 5,734,921 * | 3/1998 | Dapp et al. | 395/800.1 |
| 5,737,587 * | 4/1998 | Leung et al. | 395/552 |
| 5,773,856 * | 6/1998 | Bearden et al. | 257/207 |
| 5,894,565 * | 4/1999 | Furtek et al. | 395/500 |
| 5,926,353 * | 7/1999 | Misek | 361/56 |
| 6,002,268 * | 12/1999 | Sasaki et al. | 326/41 |

FOREIGN PATENT DOCUMENTS

| | | | |
|---|---|---|---|
| 4244615 | 12/1992 | (DE) | H01L/23/055 |
| 3060050 | 3/1991 | (JP) | H01L/21/60 |

\* cited by examiner

*Primary Examiner*—Alexander O. Williams

(57) ABSTRACT

Semiconductor die pad design consisting of an I/O cell where the outside bond site is connected to the cell's active signal, the second inside bond site is discrete and connected to one of the I/O power supplies Vdd or Vss, and the third inside bond site is discrete and connected to the compliment of the second pad site. The I/O cell design is universal to traditional wire-bonding assemblies and flip-chip assemblies.

31 Claims, 5 Drawing Sheets

UNIVERSAL I/O PAD STRUCTURE FOR IN-LINE OR STAGGERED WIRE BONDING OR ARRAYED FLIP-CHIP ASSEMBLY

BACKGROUND OF THE INVENTION

1. Technical Field

The present invention relates to semiconductor die pad structures having traditional in-line pad cell design with each cell supporting multiple pad sites and, more particularly, to cell pad designs that are universal in application and take advantage of the power and ground ring locations that are a common architecture for integrated circuit design.

2. Description of Related Art

Traditional semiconductor die design provides for a single array of I/O bonding or pad sites arranged around the periphery of the die. For a typical wire-bonded package design, these bonding sites, also referred to as pads, are connected to a lead frame by gold wires connecting to each desired site. The bonding sites consist of signal sites, Vss (ground or lower power) sites and Vdd (power or upper power) sites. A prior art signal and power/ground pin arrangement is illustrated in FIG. 1, where the signal 20, Vss (ground) 30 and Vdd (power) 40 pins are placed in line as a single array, each consuming an I/O cell site 10. FIG. 1 shows four I/O cell sites 10 which, in a standard prior art die design, would be located with a number of similar cell sites around the periphery of the die. Most die pad designs use somewhere between 10 and 30 percent of the available integrated circuit (IC) pins for Vdd bond sites 40 and Vss bond sites 30.

The minimum size of the I/O cell sites 10 and bond pads 20, 30, 40 is limited by current bonding technology. Consequently, increasing the number of signal bond sites 20 may require an increase in the size of the die to accommodate the signal bond sites 20 along with the Vss bond sites 30 and Vdd bond sites 40 in the traditional I/O designs.

I/O pads on a semiconductor logic product are becoming increasingly dense, which increases the difficulty of wire-bonding. Flip-chip technology addresses this problem to some extent by eliminating the wire-bonding step, allowing closer spacing of bond pad sites. A pad structure optimized for wire-bonding, however, may not be optimal for flip-chip assembly processing and vice-versa. Some integrated circuit products may need to be available in both traditional wire-bonded QFP packages and newer flip-chip BGA packages where an optimal solution using traditional bond pad design is difficult. Although a standard lead frame can be used with most wire-bonded packages, the accepting frame on a flip-chip package might need to be designed to accommodate the unique x/y coordinates of the solder ball layout. Consequently, designing a library of I/O cells to accommodate both assembly processes optimally often proves to be very difficult. The alternative, unique designs for different applications, can be very expensive.

The requirement for power and ground pins on complex semiconductor logic products is also increasing. Consuming valuable I/O pad space with a Vdd or Vss pad sites can be costly and may increase the size of the die if the die is pad-limited. A need exists, therefore, to accommodate more Vdd and Vss I/O connections without correspondingly increasing the die size. Ideally, this need should be addressed with a design that takes advantage of the traditional location of Vdd and Vss bus rings, thus reducing manufacturing costs and simplifying design considerations.

Accordingly, a need exists for a universal I/O pad structure design for in-line or staggered wire-bonding or arrayed flip-chip assemblies which will optimize the I/O cell to signal bond site ratio and provide a universal design for the placement of Vss and Vdd pad sites. This approach would alleviate the need to go to larger chip design to accommodate additional signal bond sites and make chip designs more uniform, thus greatly reducing manufacturing and design costs.

SUMMARY OF THE INVENTION

This invention proposes I/O cell bond site designs incorporating the advantages of the power and ground ring location, which is common architecture for integrated circuit design. The present invention utilizes multiple rows, in depth, of bond sites placed either staggered or in-line on the I/O cells. Common to each embodiment is the principal that all of the bond sites nearest the periphery of the die should be dedicated to signal bond sites, thereby increasing the efficiency of bond site placement. In addition, each embodiment of the present invention utilizes arrays of interior bond sites dedicated to Vss and Vdd pins which are interior to the signal bond sites, thus taking advantage of the underlying power and ground ring location common to many IC design chips. This invention provides increased bond mapping flexibility, simplicity, and uniformity in manufacture and design, and permits additional signal pad sites for given chip size.

Another feature of this invention allows for a universal design of a semiconductor die for use in both a traditional wire-bonding assembly and a flip-chip assembly. Since the exterior array on the die is dedicated exclusively to signal sites and the interior arrays are dedicated to Vss and Vdd sites, a die configured for a traditional wire-bonded package can easily be converted for use in a flip-chip BGA package. In fact, every Vdd and Vss site on the die could be soldered to the flip-chip accepting frame. This design would, consequently, avoid the need for expensive custom package design.

The above as well as additional objectives, features, and advantages of the present invention will become apparent in the following detailed written description.

DESCRIPTION OF THE DRAWINGS

The novel features believed characteristic of the invention are set forth in the appended claims. The invention itself, however, as well as a preferred mode of use, further objectives and advantages thereof, will be best understood by reference to the following detailed description of illustrative embodiments when read in conjunction with the accompanying drawings, wherein:

DETAILED DESCRIPTION

Figure 1:
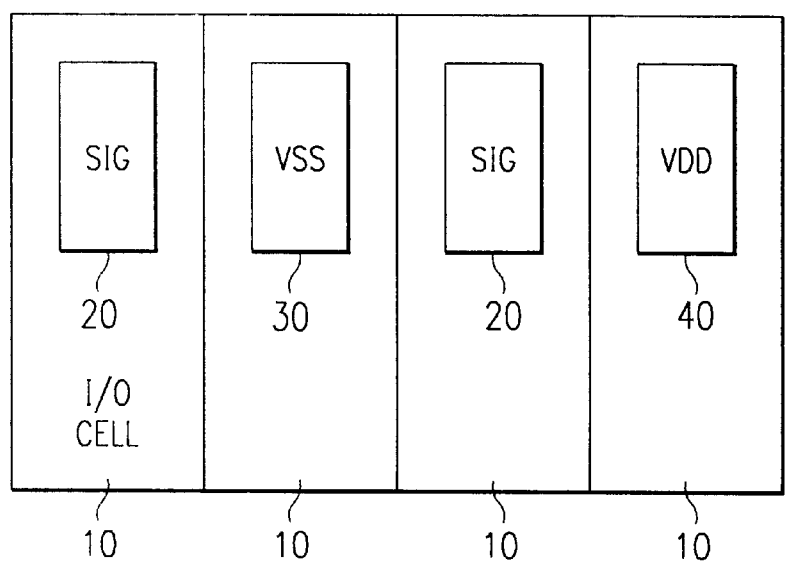
FIG. 1 illustrates a schematic of traditional signal and power/ground pad arrangements on a semiconductor die.
Figure 2:
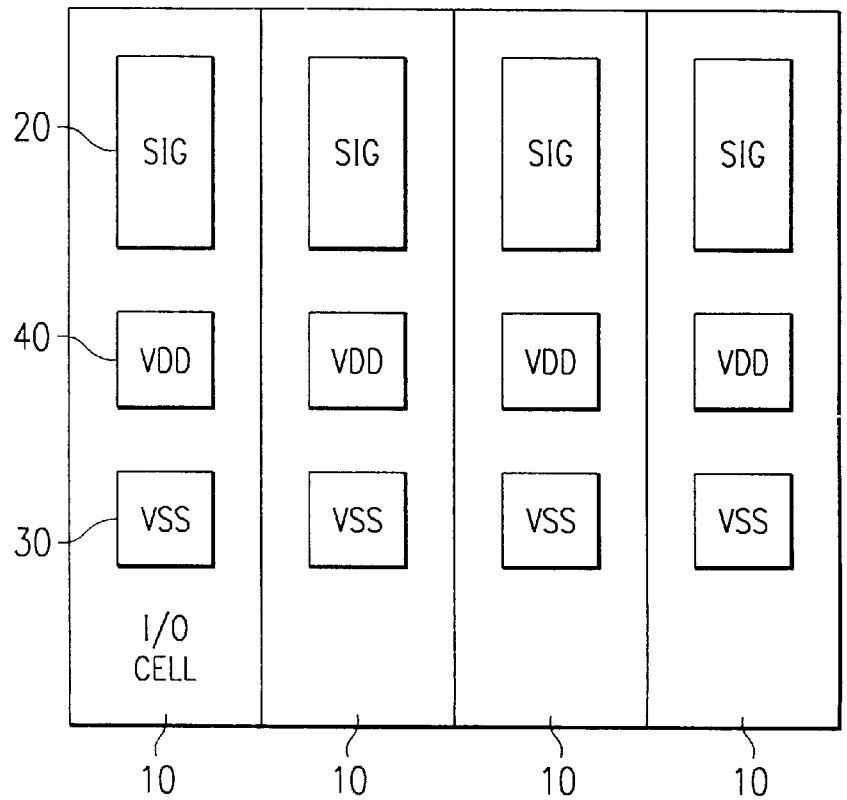
FIG. 2 illustrates a schematic of a multiple array embodiment of the present invention's signal and power/ground pad arrangement on a semiconductor die.

FIG. 2 illustrates an embodiment of the present invention showing a schematic of multiple-arrays of bond pads imposed on a traditional I/O cell layout. Corresponding reference numerals are used to identify corresponding elements unless indicated otherwise. Illustrated are four I/O cells 10, which in a traditional semiconductor die layout would be located around the periphery of the die with each I/O cell 10 dedicated to a signal bond site 20, a Vdd bond site 40, or a Vss bond site 30. Unlike traditional prior art designs, the present invention dedicates the entire exterior array of pad sites to signal bond pad sites 20. All of the Vdd bond sites 40 and Vss bond sites 30 are located in two arrays behind the signal bond sites 20, yet placed within the I/O cell 10. With this arrangement, every I/O cell 10 also has a corresponding signal bond site 20, thus providing for the maximum amount of signal bond sites 20 per I/O cell 10 around the exterior of the die. Thus, the present invention reduces the total number of I/O cells 10 needed to provide platforms for bonding sites in the traditional arrangements.

Figure 3:
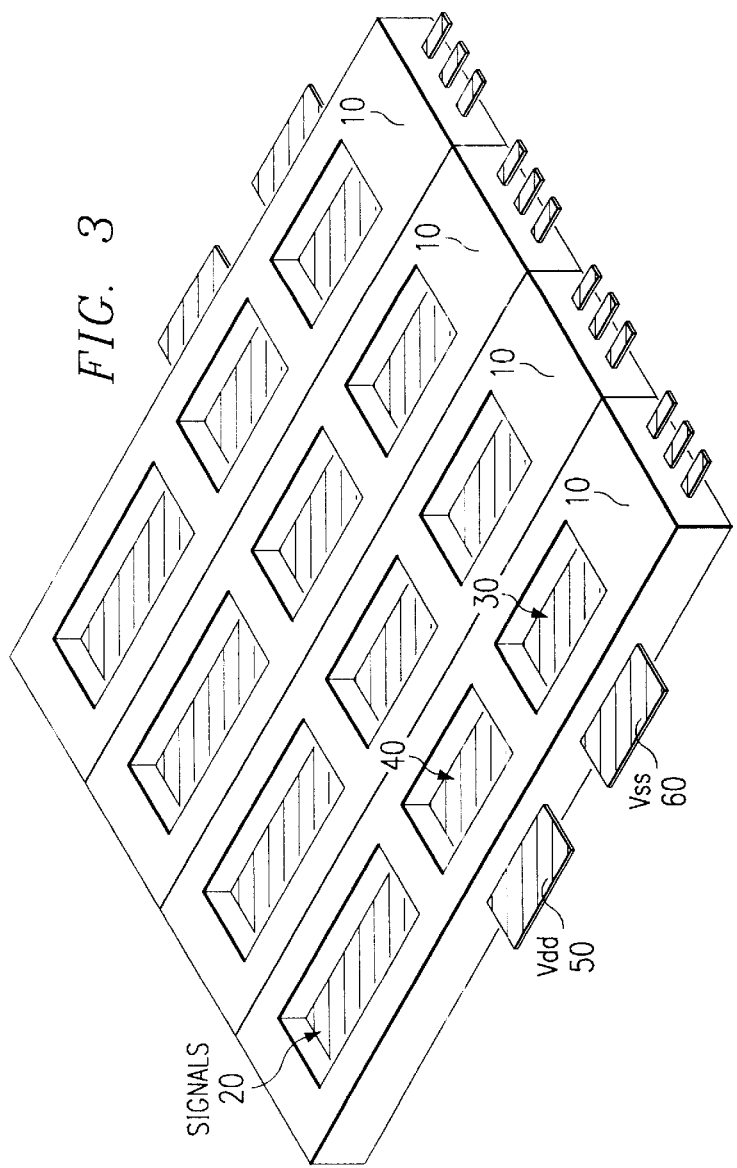
FIG. 3 illustrates an isometric presentation of a multiple array embodiment of the present invention's signal and power/ground pad arrangements on a semiconductor die.

This embodiment of the present invention additionally takes advantage of the Vdd and Vss buses which traditionally are laid out in a "ring" fashion around the periphery of the interior of the die. This configuration is illustrated in FIG. 3, which shows a perspective view of a peripheral section of the die. As with FIG. 2, FIG. 3 shows four I/O cells 10 in the traditional arrangement but with each cell containing three bond pad sites, one dedicated to signals 20, one dedicated to Vdd 40, and one dedicated to Vss 30. The Vdd bond sites 40 are placed directly over the Vdd bus 50. Likewise, the Vss bond sites 30 are placed directly over the Vss bus 60.

Figure 4:
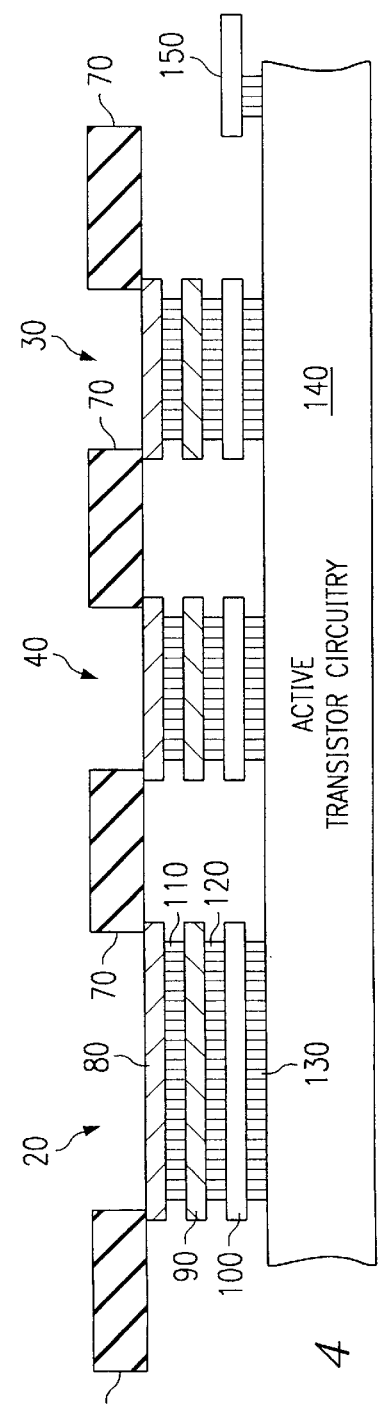
FIG. 4 illustrates a cross-sectional view of a multiple array embodiment of the present invention's I/O cell design.

FIG. 4 further illustrates this feature of the invention by showing a cross-sectional view of a universal I/O structure. On the surface of the die, the three bond sites 20, 30, 40 on a single I/O cell are separated by a passivation layer 70. Below the passivation layer 70 is metal 3 layer 80, metal 2 layer 90, and metal 1 layer 100 separated by via 2 layer 110 and via 1 layer 120, respectively. The metal 1 layer 100 is then interfaced with the active transistor circuitry 140 by a contact layer 130. Also shown is a connection for the processed signal to core logic 150. FIG. 4 shows the signal bond site 20 connected to the cell's active circuitry while the Vdd bond site 40 and the Vss bond site 30 are connected to their respective power supplies.

Figure 5:
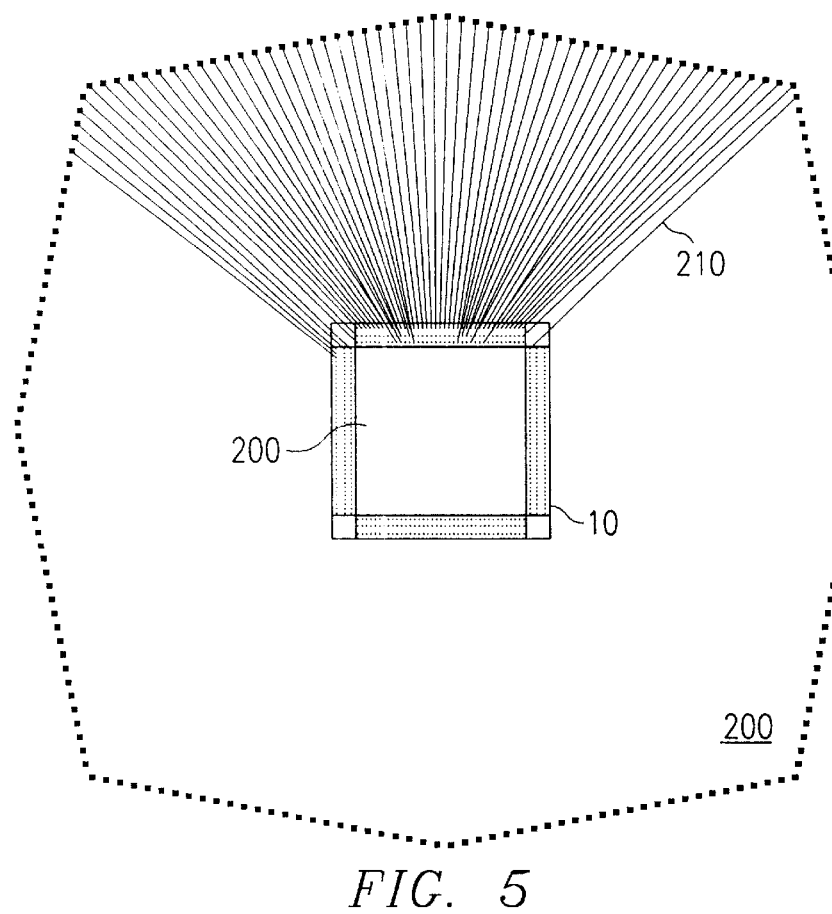
FIG. 5 illustrates a semiconductor die with multiple arrays of bond sites in a wire-bonding application.

FIG. 5 shows an overhead view of a wire-bonding die 200 with wire 210 connections from the lead frame (not shown) to the desired pad sites. The I/O cells 10 can be seen around the periphery of the die 200 with the pad sites in multiple arrays.

Figure 6:
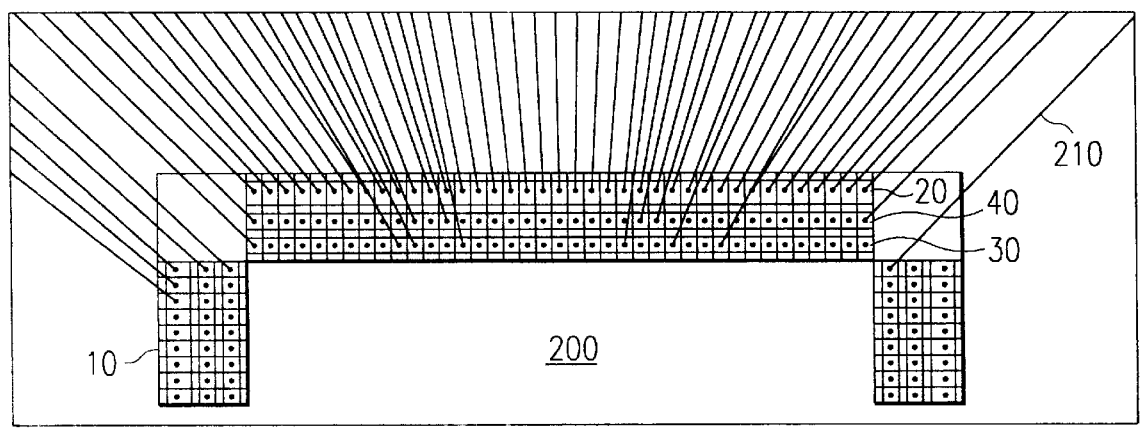
FIG. 6 illustrates a magnified view of on edge of a semiconductor die with multiple arrays of bond sites in a wire-bonding application.
Figure 7:
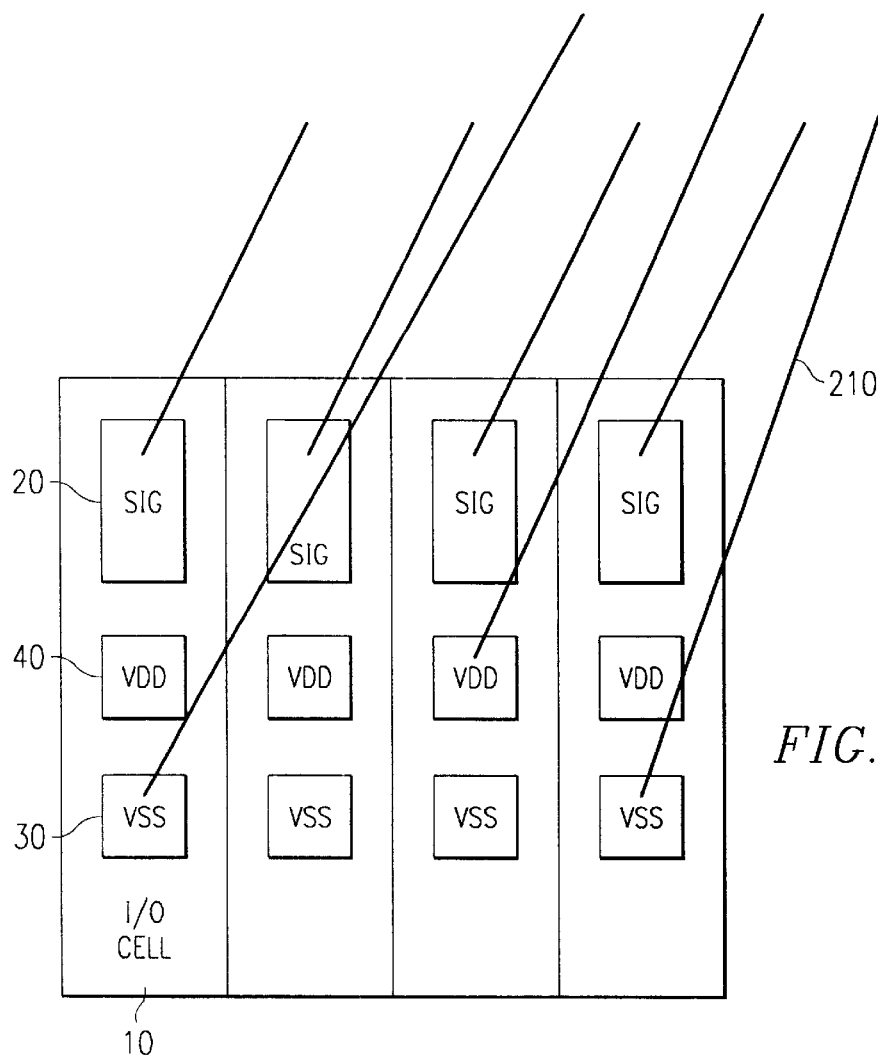
FIG. 7 illustrates a schematic of a multiple array embodiment of the present invention's signal and power/ground pad arrangements showing wire-bonding to the pad matrix.

As mentioned earlier, typically a Vss or Vdd connection is only needed for every three to four signal connections. Since the present invention incorporates a Vdd and Vss pad site on every I/O cell, the invention's layout provides substantial flexibility in the wire-bonding to the sites. While each signal bond site 20 is used when connecting the die to the lead frame, not all the Vdd bond sites 40 or Vss bond sites 30 are needed. In fact, frequently only one Vdd or Vss site is used for each three to four signal pad sites. This type of usage is illustrated by FIG. 6 and FIG. 7. FIG. 6 is a magnified view of the section of the die 200 illustrated on FIG. 5 having wire-bonding to pad sites. FIG. 6 shows the I/O cell sites 10 in traditional arrangement, but with signal pad sites 20 in a first array, the Vdd pad sites 40 in a second array, and Vss pad sites 30 in a third array. FIG. 6 shows that all of the signal pad sites 20 on the periphery of the die 200 are wire-bonded with wires 210 from the lead frame. However, relatively few Vdd pad sites 40 and Vss pad sites 30 are wire-bonded. The location of the Vdd pad sites 40 and Vss pad sites 30 interior to the signal pad site array allows for a maximum number of signal pad sites 20 to be located about the periphery of die 200. FIG. 7, which illustrates four I/O cells 10, is a further magnification of the wire-bonding illustrated by FIG. 6. Again, wires 210 from the lead frame are shown bonded to all signal sites 20, and some of the Vdd sites 40 and Vss sites 30 are bonded. Since all of the Vdd pad sites 40 and Vss pad sites 30 are active, the wire-bonding to these sites can be dictated by assembly limitations, such as wire spacing, length and angle limitations, and other limitations of crossing active silicone with a bond wire.

Figure 8:
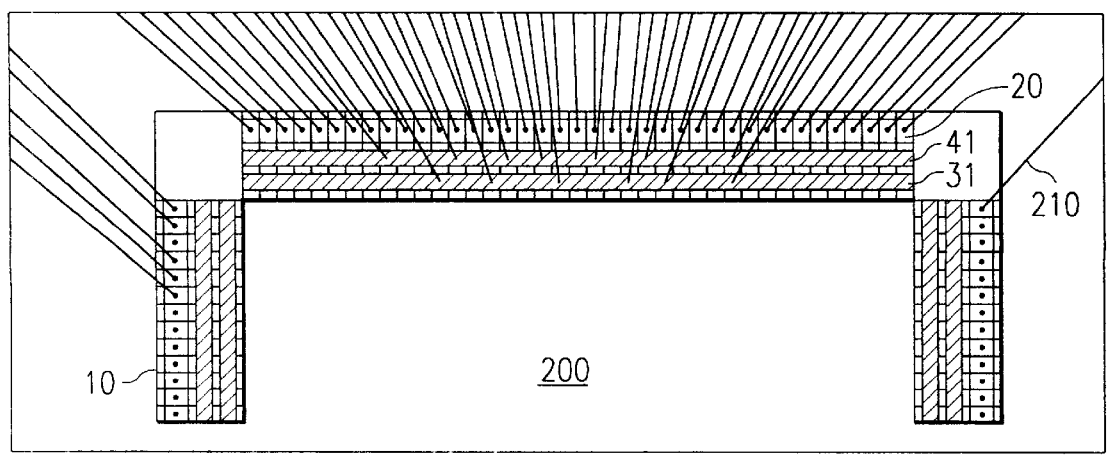
FIG. 8 illustrates a magnified view of one edge of a semiconductor die with continuous power/ground bond sites in a wire-bonding application.

The embodiment of this invention illustrated by FIG. 8 further mitigates design limitations on the Vdd and Vss pin placement of the present invention. FIG. 8, like FIG. 6, is a magnified view of one end of die 200 with wires 210 running from the lead frame to various pad sites. FIG. 8 illustrates how the discrete Vdd and Vss bond sites have been converted to continuous bond sites. The I/O cells 10 are shown in the traditional layout around the periphery of the die 200. Each I/O cell 10 again has a signal bond pad site 20 in a first array. The second array of bond sites is now, however, a continuous Vdd bond site 41, and the third array of bond sites is a continuous Vss bond site 31. Using a continuous bond site, a Vdd wire could be bonded anywhere on the Vdd bond site 41 that facilitates the best wire angle between the adjacent signal bond sites. While FIG. 8 shows that Vdd bond sites 41 and Vss bond sites 31 are continuous along the row of I/O cells 10, it is also contemplated that the Vdd and Vss continuous bond sites could be broken as needed to form isolated segments. Such an I/O structure would be a hybrid of the discrete bond site approach and the continuous approach.

Figure 9:
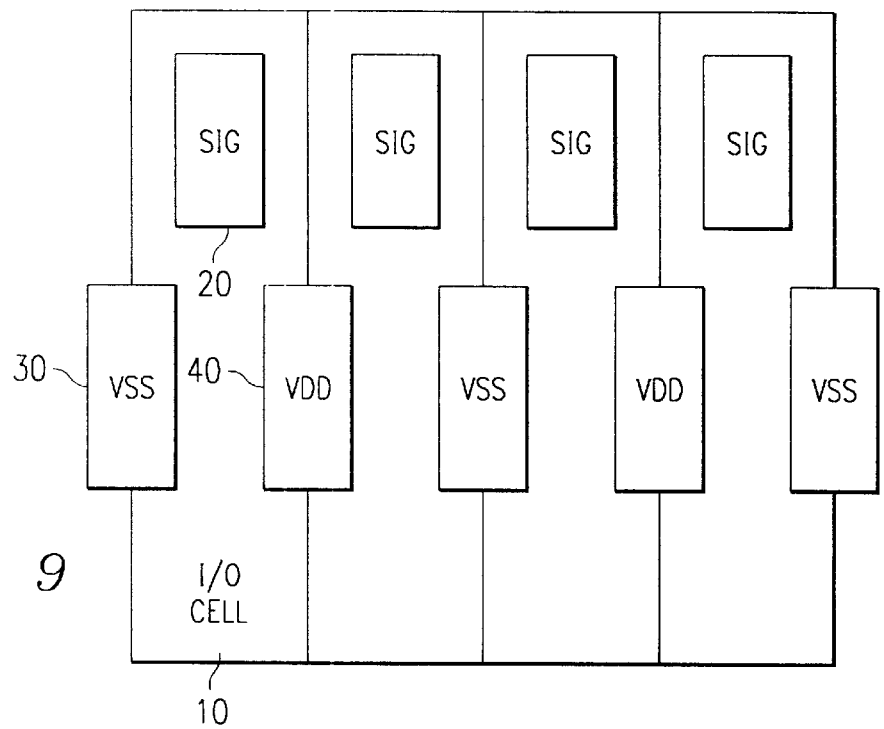
FIG. 9 illustrates a schematic of a staggered bond site embodiment of the present invention's signal and power/ground pad arrangement on a semiconductor die.

FIG. 9 illustrates another embodiment of the present invention using the staggered-pad bonding approach. Illustrated are four I/O cells 10 in a traditional I/O cell layout. FIG. 9 shows each signal pad 20 placed in the traditional pad location at the periphery of the die. As previously discussed in reference to FIGS. 3 and 4, Vdd and Vss metal buses run horizontally through each pad cell by design. An extra pad site is added to straddle the traditional I/O cell 10. The extra pad is tied into the Vdd or Vss bus to the designer's specification, thus producing Vss pad sites 30 or Vdd pad sites 40.

Figure 10:
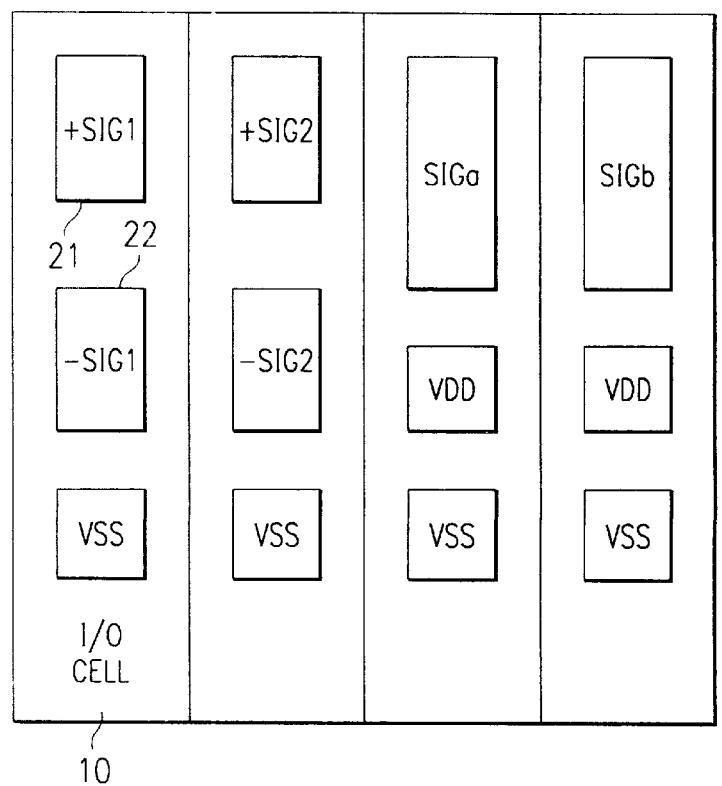
FIG. 10 illustrates a schematic of a differential signal matrix embodiment of the present invention's signal and power/ground pad arrangement on a semiconductor die.

A further embodiment of the present invention is illustrated by FIG. 10, which shows a variation on the bond site array concept. FIG. 10 illustrates four I/O cells in a traditional I/O cell layout. Some circuits require differential signals and thus two bond sites for the complimentary differential signals. Such signals and their respective bond sites are shown in FIG. 10. For example, + signal 1 pad 21 and the complimentary − signal 1 pad 22 are located on the same I/O cell 10. The placement of differential pad cells would have to be chosen carefully in the pad row but could be positioned to allow for the + and − differential signals to be wired to adjacent package pins.

Although the multi-layered arrays of pad sites on a single I/O cell design has been discussed in the context of the wire-bonded assembly, this design is also applicable to flip-chip assembly and allows for a universal pad design layout between the two technologies. Flip-chip assembly bond pads are solder bumps that, when the chip is inverted ("flipped") and inserted in the cavity of an accepting frame, can be reflowed, thus providing a direct contact with the accepting frame. As can be understood from FIG. 2, the flip-chip accepting frame in the present invention would be designed to accept Vdd sites 40 and Vss sites 30 at their interior array locations. In fact, in a flip-chip assembly, it may be possible to solder every power and ground site thus simulating the continuous bond site embodiment illustrated in FIG. 8. Consequently, the present invention allows for a universal chip design that eliminates the need for expensive custom packaging design when used in the flip-chip assembly configuration.

It is an express objective of this invention that all the embodiments disclosed have applications in both the wire-bonded and flip-chip assemblies as well as any future technologies that utilize the bond pad concept. Consequently, it is understood that references to "bond pad sites," "bond pads," and "pad sites" in this application include wire-bonding sites in traditional semiconductor packages and solder bump sites in flip-chip type packages.

While the invention has been particularly shown and described with reference to preferred embodiments disclosed herein, it would be understood by those skilled in the art that various changes in form and detail may be made therewith without departing from the spirit and scope of the invention.

What is claimed is:

1. An I/O cell on a semiconductor die having multiple I/O cell sites, said I/O cell comprising;
   a signal bond pad;
   a power bond pad; and,
   a ground bond pad.

2. The I/O cell of claim 1 wherein the signal bond pad is located at the periphery of the die.

3. The I/O cell of claim 1 wherein the power and ground bond pads are located interior to the signal bond pad site on the die.

4. The I/O cell of claim 1 wherein the power and ground bond pads are continuous connections to like pads on other I/O cells on the semiconductor die.

5. The I/O cell of claim 1 wherein the power and ground bond pads are oriented over power and ground bus rings.

6. The I/O cell of claim 1 wherein a power bond pad is connected to at least one adjacent power bond pad.

7. The I/O cell of claim 1 wherein a ground bond pad is connected to at least one adjacent ground bond pad.

8. The I/O cell of claim 1 wherein said ground bond pad straddles adjacent I/O cells.

9. The I/O cell of claim 1 wherein said power bond pad straddles adjacent I/O cells.

10. A semiconductor die comprising:
    a plurality of I/O cells arranged about the periphery of the die;
    a power bus ring within the periphery of the die;
    a ground bus ring within the periphery of the die;
    a signal pad site arrayed on each I/O cell;
    a power pad site arrayed on each I/O cell behind said signal pad site and collocated near and electrically connected with said power bus ring; and,
    a ground pad site arrayed on each I/O cell behind said signal pad site and collocated near and electrically connected with said ground bus ring.

11. The semiconductor die of claim 10 wherein power pad sites are continuous connections along part or all of each array.

12. The semiconductor die of claim 10 wherein ground pad sites are continuous connections along part or all of each array.

13. The semiconductor die of claim 10 wherein a power pad site is connected to at least one adjacent power pad site.

14. The semiconductor die of claim 10 wherein a ground pad site is connected to at least one adjacent ground pad site.

15. The semiconductor die of claim 10 wherein said power pad sites straddle said I/O cells.

16. The semiconductor die of claim 10 wherein said ground pad sites straddle said I/O cells.

17. The semiconductor die of claim 10 wherein said semiconductor is suitable for a wire-bonded package.

18. The semiconductor die of claim 10 wherein said semiconductor is suitable for a flip-chip package.

19. An I/O pad structure on a semiconductor device having a die, wherein said I/O pad comprises multiple bond pad sites.

20. The I/O pad structure of claim 19 wherein said bond pad sites are arranged to provide for the maximum number of signal pad sites to be located about the periphery of the die of said semiconductor device.

21. A semiconductor die comprising:
    a plurality of arrays of bond pad sites wherein a first array within the plurality of arrays of bond pad sites are signal pad sites; and power and ground pad site arrays within the plurality of arrays of bond pad sites are located interior on the die to said first array.

22. The semiconductor die of claim 21 wherein said power pad site arrays are continuous connections.

23. The semiconductor die of claim 21 wherein said ground pad site arrays are continuous connections.

24. The semiconductor die of claim 21 wherein said ground pad sites are collocated with a ground bus.

25. The semiconductor die of claim 21 wherein said power pad sites are collocated with a power bus.

26. A method for manufacturing semiconductor device packages, said method comprising the steps of:
    (a) manufacturing a semiconductor die having ground and power bus rings;
    (b) placing I/O cells about the periphery of the die;
    (c) placing I/O bond pad sites in arrays such that each I/O cell supports more than one bond pad site.

27. The method of claim 26 wherein the array of bond pads closest to the periphery of the die are dedicated to signal bond pads.

28. The method of claim 27 wherein an array interior on the die relative to the array dedicated to the signal bond pads is dedicated to power bond pads.

29. The method of claim 27 wherein an array interior on the die relative to the array dedicated to the signal bond pads is dedicated to ground bond pads.

30. The method of claim 27 wherein the power bond pads are collocated with the power bus ring.

31. The method of claim 29 wherein the ground bond pads are collocated with the ground bus ring.

* * * * *